United States Patent
Niiro

(10) Patent No.: US 6,178,125 B1
(45) Date of Patent: Jan. 23, 2001

(54) SEMICONDUCTOR MEMORY DEVICE PREVENTING REPEATED USE OF SPARE MEMORY CELL AND REPAIRABLE BY CELL SUBSTITUTION UP TO TWO TIMES

(75) Inventor: Mitsutaka Niiro, Hyogo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/478,335

(22) Filed: Jan. 6, 2000

(30) Foreign Application Priority Data

Jul. 2, 1999 (JP) .................................... 11-188787

(51) Int. Cl.$^7$ ..................................... G11C 13/00
(52) U.S. Cl. ....................... 365/200; 365/210; 365/230.01
(58) Field of Search ..................................... 365/200, 210, 365/230.01, 230.03, 233, 231, 96

(56) References Cited

U.S. PATENT DOCUMENTS 4,959,564 * 9/1990 Steele ............................... 365/189.01
5,367,207   11/1994 Goetting et al. .

FOREIGN PATENT DOCUMENTS 5-54692   3/1993 (JP) .
7-37984   2/1995 (JP) .

* cited by examiner

*Primary Examiner*—Terrell W. Fears
(74) *Attorney, Agent, or Firm*—McDermott, Will & Emery

(57) ABSTRACT

A complementary address generation circuit supplies a fuse select address signal as it is at a first fuse blow and converts the fuse select address signal to a complementary address and supplies the complementary address as an output at a second fuse blow. The output of the complementary address generation circuit is supplied to a fuse select circuit and the fuse select circuit selects a fuse group to which a substitution address is to be allocated. The fuse group used at the first fuse blow is selected in ascending order and at the second fuse blow the fuse group is selected in descending order. Thus, the spare used at the first fuse blow will be prevented from being used again in the second fuse blow and a repairable semiconductor memory device will not be rendered defective.

12 Claims, 13 Drawing Sheets

FIG. 6

| BSEL1 | BSEL0 | BSIG |
|---|---|---|
| 0 | 0 | → [0] |
| 0 | 1 | → [1] |
| 1 | 0 | → [2] |
| 1 | 1 | → [3] |

FIG. 7

| BSEL1 | BSEL0 | BSIG |
|---|---|---|
| 0 | 0 | → [3] |
| 0 | 1 | → [2] |
| 1 | 0 | → [1] |
| 1 | 1 | → [0] |

SEMICONDUCTOR MEMORY DEVICE PREVENTING REPEATED USE OF SPARE MEMORY CELL AND REPAIRABLE BY CELL SUBSTITUTION UP TO TWO TIMES

BACKGROUND OF THE INVENTION

1. Field of the Invention

The present invention relates to semiconductor devices, and more particularly to semiconductor memory devices with redundant circuits (spare circuits) having circuit structures allowing a device with a defect to be repaired through use of a spare memory cell in place of a defective memory cell.

2. Description of the Background Art

In the semiconductor memory device with the redundant circuit, when the device is found to be defective, the device can be repaired to work as a good device through the use of a redundant circuit (hereinafter referred to as a spare) formed as a spare circuit in place of a memory cell column or a memory cell row having a defective bit in the semiconductor memory device.

Generally, the redundant circuit is formed to take effect only on a defective memory cell column and a defective memory cell row that needs repair through the use of an apparatus (hereinafter referred to as a laser trimmer) for blowing a fine wiring. The laser trimmer generates a laser light beam, and a plurality of wirings (hereinafter referred to as a fuse) in the redundant circuit that can be blown are selectively irradiated with the laser light beam and cut off. This method will hereinafter be referred to as laser trimming method.

A defective memory cell column or a defective memory cell row can be repaired but by the laser trimmer. One of available methods is a method of electrically heating and blowing a fuse which is a resistive element through application of a high voltage on the fuse from an external source. This method will hereinafter be referred to as electric fuse method and the fuse employed in this method will be called an electric fuse. According to the electric fuse method, the electric fuse can be blown through the application of a high voltage from an external source even after the packaging of the semiconductor device, whereby a final product yield can be increased. In the case of the laser trimming method, the device cannot be repaired after the packaging because it is impossible to apply a laser light beam on a fuse already in the package.

FIG. 13 is a block diagram showing an internal structure of a conventional semiconductor memory device having a redundant circuit and particularly is referred to for describing how a spare is selected.

It is well known that a memory cell column or a memory cell row having a defective bit in a semiconductor memory device can be located, in other words, an address of the defective bit can be determined through a test of the semiconductor memory device including the redundant circuit by an external testing device (such as a tester).

With reference to FIG. 13, the conventional semiconductor memory device includes main memory cells 352, a main address decoder 350 for receiving and decoding an address signal AD and selecting a memory cell having an address corresponding to the decoded signal from main memory cells 352, a fuse select circuit 344 receiving and decoding a fuse select address signal BSEL when a defective memory cell is to be repaired and receiving an address strobe signal /AS in a normal operation to supply a fuse select signal BSIG as an output, a redundant circuit program fuse 346 receiving address signal AD and fuse select signal BSIG and supplying a spare select signal SPSEL as an output, a decoder inactivating circuit 348 receiving the spare select signal and inactivating main address decoder 350, a spare address decoder 354 receiving and decoding the spare select signal, and, spare memory cells 356 activated in a portion corresponding to the spare select signal decoded by the spare address decoder.

When the device is repaired by allocating an address of a defective memory cell to a spare memory cell 356, the repair can be achieved by storing (programming) address information corresponding to the defective bit in redundant circuit program fuse 346. To store the address information corresponding to the defective bit, a plurality of fuses formed of a material of wiring such as aluminum and polycrystalline silicon are selectively blown by a laser light beam in the case of the laser trimming method or by the application of a high voltage on the ends of fuse in the case of the electric fuse method.

When a main memory cell 352 in the semiconductor memory device is to be accessed from an external source, address signal AD is applied from the external source and a desired main memory cell column or a main memory cell row is accessed via main address decoder 350.

On the other hand, if a main memory cell 352 is found to have a defect and a spare memory cell 356 needs to be employed in the place thereof, information corresponding to an address of the defective memory cell is stored in redundant circuit program fuse 346. On the input of an address from the external source, an address corresponding to information stored in redundant circuit program fuse 346 and the input address are compared. When two addresses are found to match as the result of comparison, it is determined that the use of a spare is requested, and redundant circuit program fuse 346 supplies spare select signal SPSEL as an output.

When selection of a spare is requested and spare select signal SPSEL is supplied as an output, decoder inactivating circuit 348 supplies an inactivation signal to main address decoder 350 and inactivating main address decoder 350 to prevent access to main memory cell 352.

Spare select signal SPSEL is decoded by spare address decoder 354. Based on the result of decoding, a spare memory cell 356 is selected.

Thus, the spare can be employed when a particular address (address of a cell to be repaired: also referred to as substitution address) is input.

Next, a process of selecting a spare line among a plurality of spare lines and a process of storing a substitution address will be described.

FIG. 14 is a simplified block diagram referenced for describing the process of selecting a spare.

In FIG. 14, for the simplicity of the description, an address space of main memory cells 356 is assumed to be two bits, in other words, four addresses exists, and spare lines of two bits, that is, four spare lines are employed. As there is four spare lines, four spare select signals SPSEL0–SPSEL3 are employed and correspond to spare memory cells 360, 361, 362 and 363, respectively. For example, when spare memory cell 362 is to be selected, spare select signal SPSEL2 is activated.

To designate a memory cell to be connected among four spare memory cell 360–363, fuse select address signal BSEL is employed. Fuse select address signal BSEL is generated in the semiconductor memory device or in a source external to the semiconductor memory device. As there is four spares in this case, fuse select address signal BSEL includes two 2-bit signals BSEL0 and BSEL1.

Fuse select address signal BSEL is decoded by fuse select decoder 344 to fuse select signal BSIG corresponding to a spare memory cell. Fuse select signal BSIG includes four signal bits BSIG0, BSIG1, BSIG2 and BSIG3. When a first substitution address is to be stored, BSIG0 is applied to redundant circuit program fuse 346. When a second substitution address is to be stored, when a third substitution address is to be stored and when a forth substitution address is to be stored, BSIG1, BSIG2 and BSIG3 are applied to redundant circuit program fuse 346, respectively. Hence, when a firs substitution address is selected, the content of the fuse select address signal is BSEL0=0, BSEL1=0 and fuse select signal BSIG0=H and fuse select signalsBSIGI–BSIG3 are at an L level.

In some cases, it is desirable to repair a defective bit through the use of an unused spare when a defective bit is produced after the repair process, for example, in a process after the packaging. In the conventional semiconductor memory device with the redundant circuit employing the electric fuse method, if the information of use of a spare in the redundant circuit employed for a first substitution is not stored in the semiconductor memory device or in an external memory device, the address of the spare employed at the first substitution may possibly be selected again at a second substitution. Then, the defect which should have been repaired cannot be appropriately repaired and the product yield decreases.

In order to store information on the spare of the redundant circuit employed for the substitution in the semiconductor memory device, a non-volatile memory such as a flash memory and a ferroelectric memory can be used to prevent erasure of stored information. In this case, however, many additional circuits are required for incorporation of the non-volatile memory and an area of semiconductor memory device increases.

On the other hand, when the information is to be stored in the external memory device or the like, in addition to the information on the use of spare, identification information corresponding to each chip must be stored. In this case, means must be provided to correctly maintain the correspondence between the chip and the spare use information even after the packaging. Hence, an additional process for identification and so on are required, resulting in the higher cost of the semiconductor memory device.

SUMMARY OF THE INVENTION

An object of the present invention is to provide a semiconductor memory device capable of preferentially selecting a spare address at a second spare substitution process so that a used spare will not be selected again.

In brief, the present invention is a semiconductor memory device including a regular memory cell region, a main address decoder, a spare memory cell region, a spare address decoder, and a substitution control circuit.

The regular memory cell region includes a plurality of regular memory cell groups each including a plurality of regular memory cells. The main address decoder is provided corresponding to the regular memory cell region and selects one of the regular memory cell groups in response to an address signal. The spare memory cell region includes a plurality of spare memory cell groups each including a plurality of spare memory cells and usable in place of the regular memory cell groups by substitution. The spare address decoder is provided corresponding to the spare memory cell region and selects one of said spare memory cell groups in response to a spare address signal. The substitution control circuit holds a substitution address data corresponding to a substitution address of the regular memory cell group to be substituted by the spare memory cell group, inactivates the main address decoder and supplies the spare address signal as an output when the address signal matches with the substitution address. The substitution control circuit includes a plurality of address setting portions provided corresponding to the plurality of spare memory cell groups, respectively, and holding the substitution address data, and a setting portion select circuit selecting one of the plurality of address setting portions according to a setting portion select signal. The setting portion select circuit has a holding circuit holding in a non-volatile manner, information that substitution operation of substituting the regular memory cell group with the spare memory cell group has been performed and determines an order of priority of use of the plurality of address setting portions corresponding to the setting portion select signal according to the information held by the holding circuit.

Therefore, a main advantage of the present invention is that a spare address can be preferentially selected at the second spare substitution process so that the used spare will not be employed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is referenced for describing which fuse select signal BSIG is activated when a fuse select address signal BSEL0 is input at a first fuse blow in the first embodiment;

FIG. 7 is referenced for describing the correspondence between a fuse select address signal BSEL and a fuse select signal at a second substitution;

DESCRIPTION OF THE PREFERRED EMBODIMENTS

Figure 1:
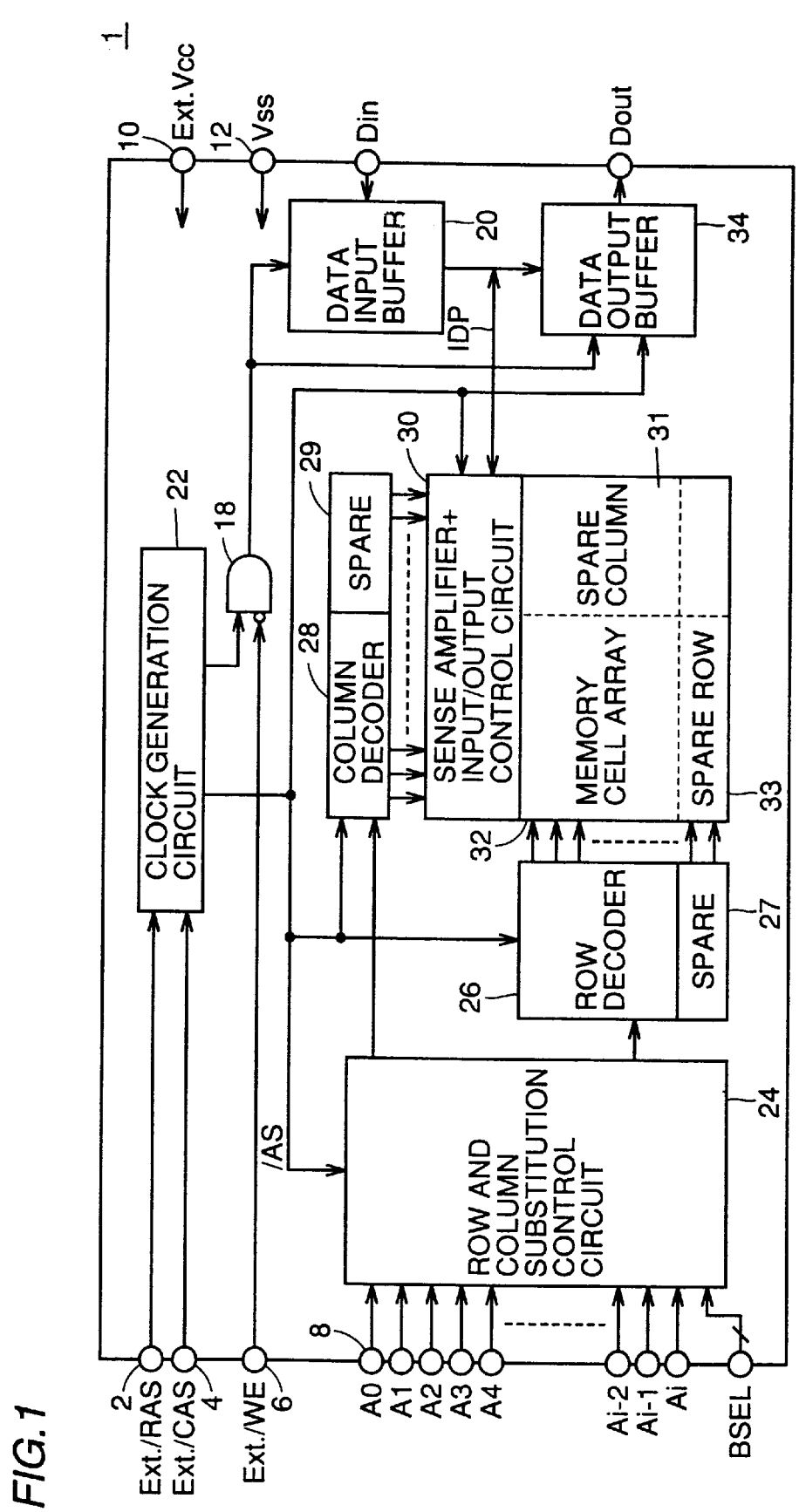
FIG. 1 is a schematic block diagram showing a structure of a semiconductor memory device 1 according to the first embodiment of the present invention.

Hereinafter the embodiments of the present invention will be described in detail with reference to the drawings. In the drawings, the same or a similar reference character denotes the same or a corresponding portion.

First Embodiment

With reference to FIG. 1, a semiconductor memory device 1 includes control signal input terminals 2–6 receiving control signals ext./RAS, ext./CAS, and ext./WE, respectively, a group of address input terminals 8, an input terminal Din for data signal input, an output terminal Dout for data signal output, a ground terminal 12 receiving a ground potential Vss and a power supply terminal 10 receiving a power supply potential Ext. Vcc.

Semiconductor memory device 1 further includes a clock generation circuit 22, a row and column substitution control circuit 24, a row decoder 26, a column decoder 28, a sense amplifier+input/output control circuit 30, a memory cell array 32, a gate circuit 18, a data input buffer 20 and a data output buffer 34.

Clock generation circuit 22 generates a control clock according to an operation mode based on external row address strobe signal ext./RAS and external column address strobe signal ext./CAS supplied from an external source via control signal input terminals 2 and 4, and controls an operation of the semiconductor memory device as a whole.

Row and column substitution control circuit 24 generates an address signal based on address signals A0–Ai (i is a natural number) and supplies the generated address signal to row decoder 26 and column decoder 28.

A memory cell in memory cell array 32 designated by row decoder 26 and column decoder 28 receives/transmits data from/to an external source through input terminal Din or output terminal Dout via sense amplifier+input/output control circuit 30 and data input buffer 20 or data output buffer 22.

Semiconductor memory device 1 further includes spare columns 31 for substituting for a defective memory cell, a spare column decoder 29 for selecting a spare column, spare rows 33 for substituting for a defective memory cell, and a spare row decoder 27 for selecting a spare row 33.

Semiconductor memory device 1 shown in FIG. 1 is merely a representative example and the present invention can be applied to a synchronous semiconductor memory device (SDRAM) as well.

Figure 2:
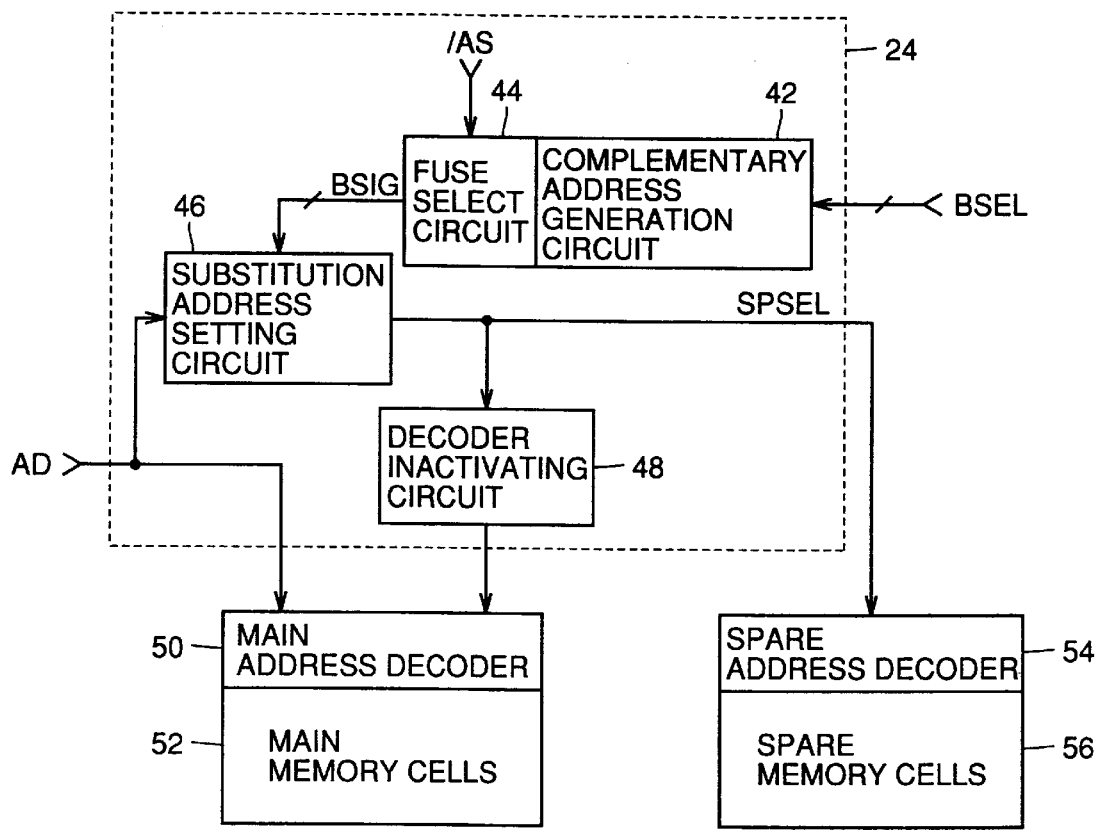
FIG. 2 is a block diagram referenced for describing a structure of a row and column substitution control circuit 24 shown in FIG. 1.

With reference to FIG. 2, row and column substitution control circuit 24 includes a complementary address generation circuit 42 receiving a fuse select address signal BSEL supplied for selecting a fuse to store an address of a cell to be repaired and supplying the fuse select address signal BSEL as it is at a first substitution and supplying a complementary address at a second substitution, a fuse select circuit 44 supplying a fuse select signal BSIG according to an output of the complementary address generation circuit and an address strobe signal /AS, a substitution address setting circuit 46 supplying a spare select signal SPSEL according to an address signal AD supplied from an external source and fuse select signal BSIG, and a decoder inactivating circuit 48 inactivating main address decoder 50 when spare select signal SPSEL is activated. When spare select signal SPSEL is activated, the spare address decoder decodes spare select signal SPSEL and activates a corresponding spare memory cell 56. Though in FIG. 2, for simplicity of the description, the circuit is not shown as being divided into a row control portion and a column control portion, in practice, a block shown in FIG. 2 is provided corresponding to each of the row decoder and the column decoder.

Figure 3:
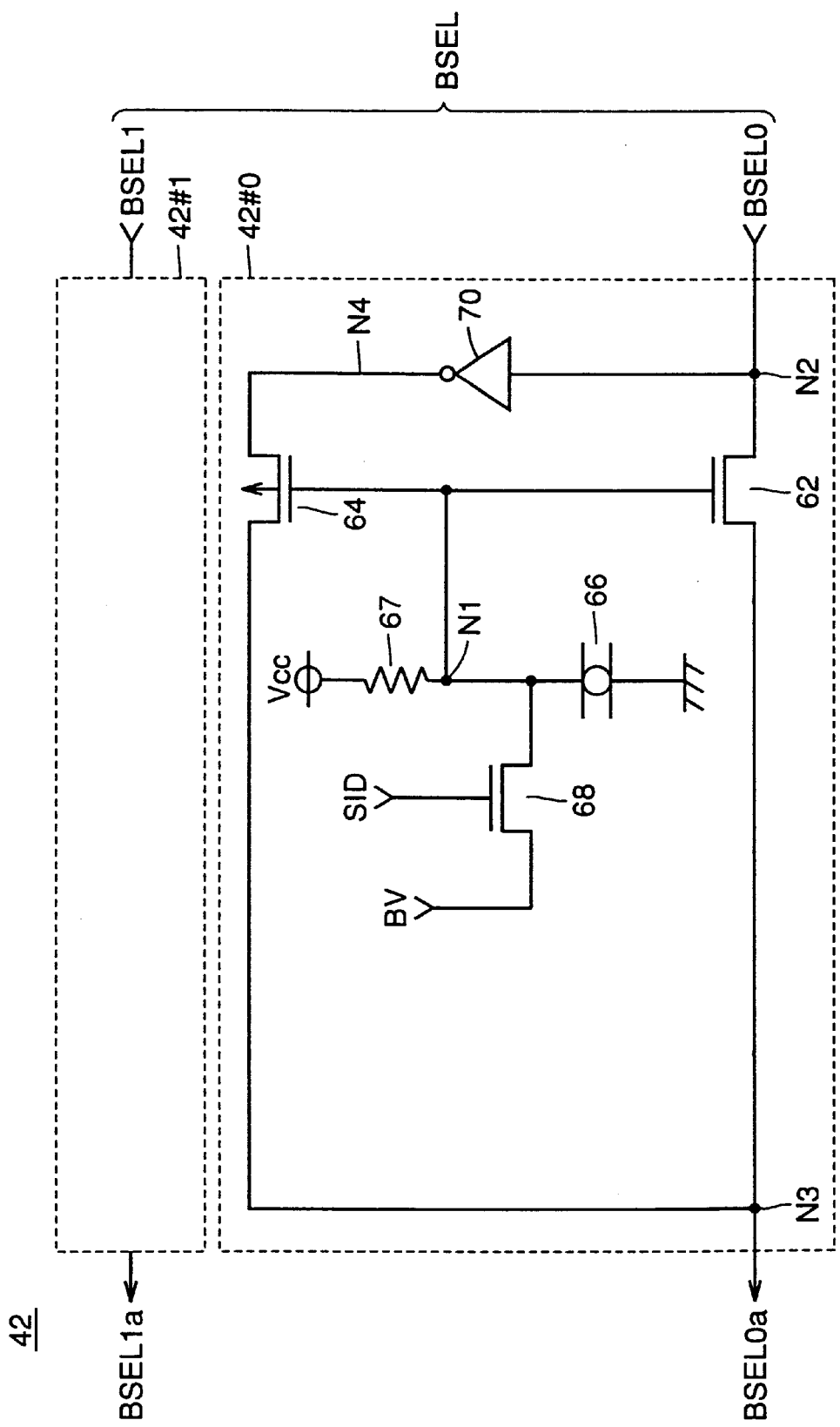
FIG. 3 is a circuit diagram showing a structure of complementary address generation circuit 42 shown in FIG. 2.

With reference to FIG. 3, complementary address generation circuit 42 includes a circuit 42#0 receiving a fuse select address signal BSEL0 and supplying a signal BSEL0a as an output and a circuit 42#1 receiving a fuse select address signal BSEL1 and supplying a signal BSEL1a as an output.

Circuit 42#0 includes an N channel MOS transistor 68 activated in response to an identification signal SID on a gate at the completion of the first substitution and transmitting a high voltage BV to a node N1, a resistance 67 connected between a power supply node receiving power supply potential Vcc and a node N1, and an anti fuse 66 connected between node N1 and a ground node.

A process of applying a laser light beam or an electric signal on a particular fuse and changing its electric property for storing an address of a cell to be repaired is called a blow. The anti fuse is one type of electric fuses and a portion between electrodes thereof become conductive when being blown.

Anti fuse 66 is an element having a high resistance before the programming and changing its conduction state to a low resistance when a voltage of a suitable level is applied as described in Japanese Patent Laying-Open No. 7-37984. The anti fuse has a capacitor-type structure and includes two conductive layers of aluminum or the like, with a thin insulation layer of silicon dioxide or the like posed therebetween, for example. This structure itself works as a capacitor, that is, as an open circuit. However, when this element is blown by the application of a high voltage, a conductive path is formed in the insulation layer and the element turns to be a resistive element with a resistance of about a few K Ω.

When high voltage BV is applied to node N1, anti fuse 66 is rendered conductive and thereafter node N1 is at a potential approximately equal to the ground node. Hence, node N1 is at an H (logical high) level when the first fuse blow is effectuated, and at an L (logical low) level when a second fuse blow becomes necessary because anti fuse 66 has been blown at the completion of the fist fuse blow.

Circuit 42#0 further includes an N channel MOS transistor 62 connected between a node N2 and a node N3 and having a gate connected to node N1, an inverter 70 receiving and inverting fuse select address signal BSEL0 supplied to node N2 and supplying the resulting signal to a node N4, and a P channel MOS transistor 64 connected between node N4 and node N3 and having a gate connected to node N1.

Signal BSEL0a, which is an output of complementary address generation circuit 42, is supplied as an output from node N3.

In FIG. 3, only fuse select address signal BSEL0 of 2-bit signals included in fuse select address signal BSEL is shown in detail. Similar circuit 42#1 is provided for fuse address signal BSEL1 as well and supplies signal BSEL1a corresponding thereto as an output. In this case, resistance 67, anti fuse 66 and N channel MOS transistor 68 determining the potential of node N1 can be shared between circuits 42#0 and 42#1.

As node N1 is at an H level at the first fuse blow, N channel MOS transistor 62 is rendered conductive and fuse select address signal BSEL0 supplied to node N2 is sent to node N3 as it is. At the second fuse blow, as node N1 is at an L level as described above, N channel MOS transistor 62 is in an nonconductive state and instead, P channel MOS transistor 64 connected between node N4 and node N3 is rendered conductive, and fuse select address signal BSEL0 is inverted by inverter 70. Hence, signal BSEL0a is an inverse of fuse select address signal BSEL0.

Figure 4:
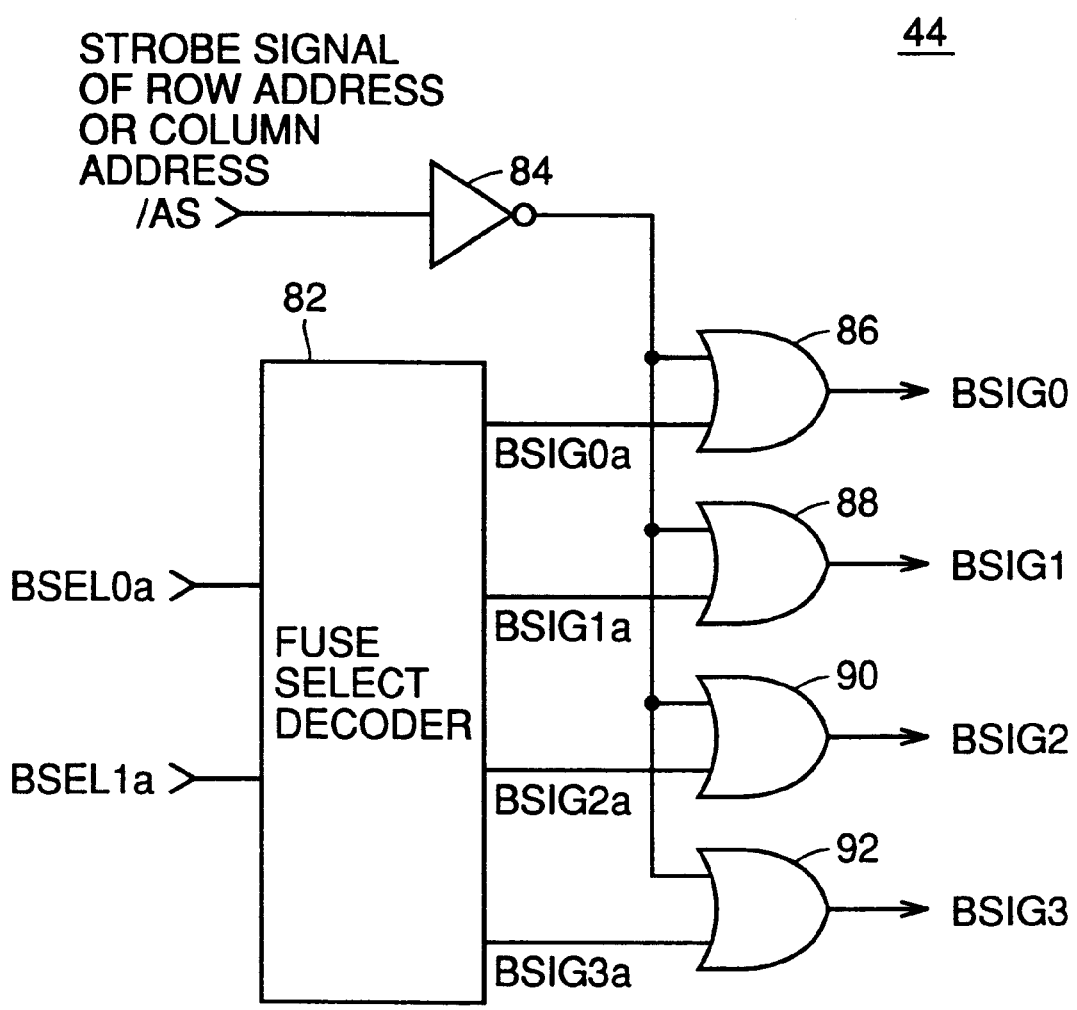
FIG. 4 is a circuit diagram showing a structure of a fuse select circuit 44 shown in FIG. 2.

With reference to FIG. 4, fuse select circuit 44 includes a fuse select decoder 82 receiving and decoding output signals BSEL0a and BSEL1a of complementary address generation circuit 42, an inverter 84 receiving and inverting strobe signal /AS of a row address or a column address, an OR circuit 86 receiving an output signal BSIG0a of fuse select decoder 82 and an output of inverter 84 and supplying a fuse select signal BSIG0 as an output, an OR circuit 88 receiving an output signal BSIG1a of fuse select decoder 82 and the output signal of inverter 84 and supplying a fuse select signal BSIG1 as an output, an OR circuit 90 receiving an output signal BSIG2a of fuse select decoder 82 and the output signal of inverter 84 and supplying a fuse select signal BSIG2 as an output, and an OR circuit 92 receiving an output signal BSIG3a of fuse select decoder 82 and the output signal of inverter 84 and supplying a fuse select signal BSIG3 as an output.

Fuse select decoder 82 receives and decodes signals BSEL0a and BSEL1a and activates one of output signals BSIG0a–BSIG3a. OR circuits 86–92 activate all fuse select signals BSIG0–BSIG3 in response to an activation of strobe signal /AS when a row address or a column address is input from an external source, and supplies signals BSIG0a–BSIG3a decoded according to fuse select address signal BSEL supplied from an external source as fuse select signals BSIG0–BSIG3 when strobe signal /AS is inactivated.

Figure 5:
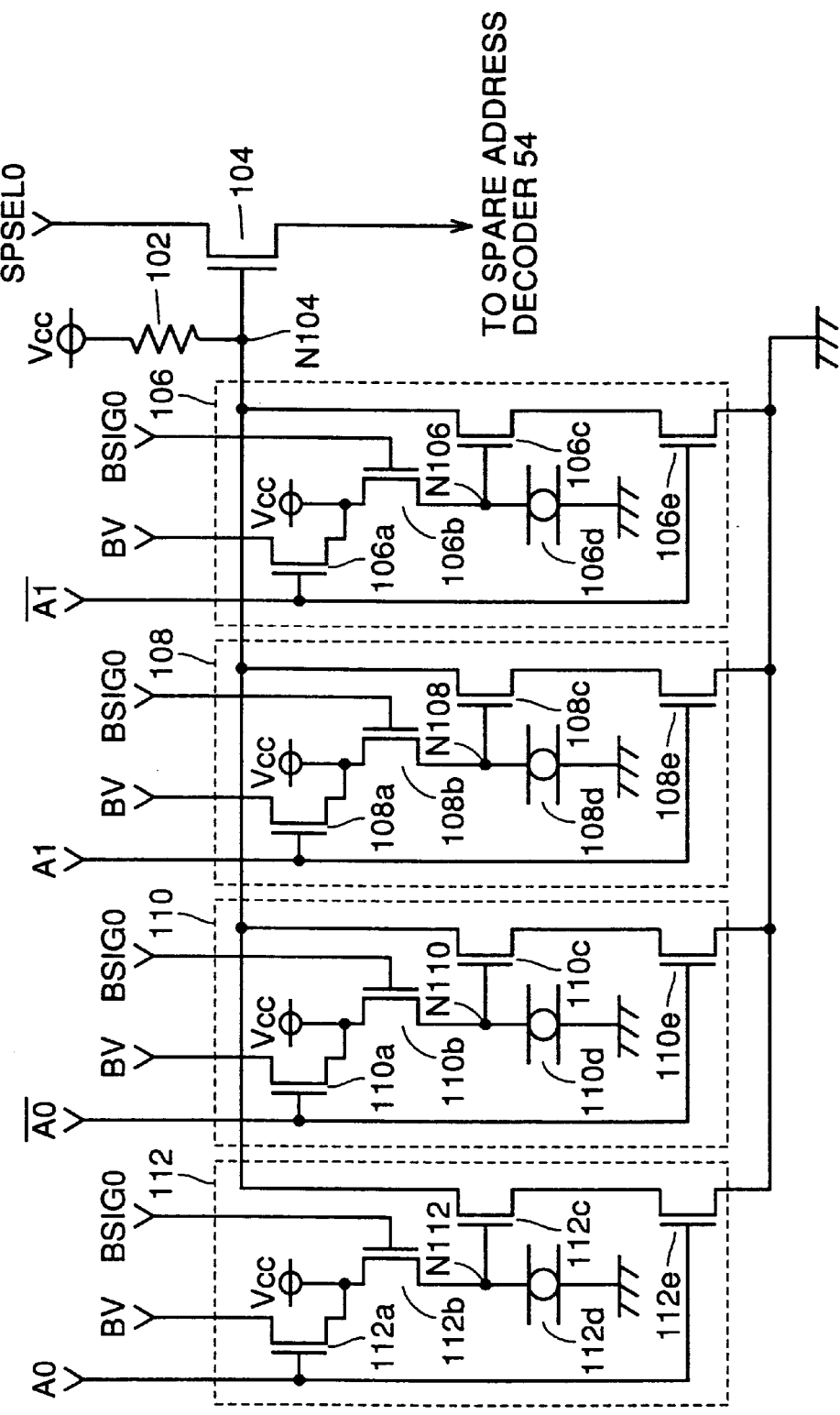
FIG. 5 is a circuit diagram showing a structure of substitution address setting circuit 46 shown in FIG. 2.

With reference to FIG. 5, substitution address setting circuit 46 includes a setting portion 112 provided corresponding to address signal A0 in which address information is programmed by high voltage BV when fuse select signal BSIG0 is activated, a setting portion 110 provided corresponding to an address signal /A0 in which address information is set by high voltage BV when fuse select signal BSIG0 is activated, a setting portion 108 provided corresponding to address signal A1 in which address information is set by high voltage BV when fuse select signal BSIG0 is activated, a setting portion 106 provided corresponding to an address signal /A1 in which address information is set by high voltage BV when fuse select signal BSIG0 is activated, a resistance 102 connected between a power supply node receiving power supply potential Vcc and a node N104, and an N channel MOS transistor 104 having a gate connected to node N104 and transmitting a spare select signal SPSEL0 to spare address decoder 54.

Setting portion 112 includes an N channel MOS transistor 112a activated by address signal A0 and transmitting high voltage BV, an N channel MOS transistor 112b activated by fuse select signal BSIG0 and transmitting power supply potential Vcc at the normal operation and transmitting high voltage BV delivered by N channel MOS transistor 112a at substitution information setting to a node N112, an anti fuse 112d connected between node N112 and a ground node, and N channel MOS transistors 112c and 112e connected in series between node N104 and a ground node.

N channel MOS transistor 112c has a gate connected to node N112 and N channel MOS transistor 112e has a gate receiving address signal A0.

Setting portion 110 includes an N channel MOS transistor 110a activated by address signal /A0 and transmitting high voltage BV, an N channel MOS transistor 110b activated by fuse select signal BSIG0 and transmitting power supply potential Vcc at the normal operation and transmitting high voltage BV delivered by N channel MOS transistor 110a at substitution information setting to a node N110, an anti fuse 110d connected between node N110 and the ground node, and N channel MOS transistors 110c and 110e connected in series between node N104 and the ground node.

N channel MOS transistor 110c has a gate connected to node N110 and N channel MOS transistor 110e has a gate receiving address signal /A0.

Setting portion 108 includes an N channel MOS transistor 108a activated by address signal A1 and transmitting high voltage BV, an N channel MOS transistor 108b activated by fuse select signal BSIG0 and transmitting power supply potential Vcc at the normal operation and transmitting high voltage BV delivered by N channel MOS transistor 108a at substitution information setting to a node N108, an anti fuse 108d connected between node N108 and the ground node, and N channel MOS transistors 108c and 108e connected in series between node N104 and the ground node.

N channel MOS transistor 108c has a gate connected to node N108 and N channel MOS transistor 108e has a gate receiving address signal A1.

Setting portion 106 includes an N channel MOS transistor 106a activated by address signal /A1 and transmitting high voltage BV, an N channel MOS transistor 106b activated by fuse select signal BSIG0 and transmitting power supply potential Vcc at the normal operation and transmitting high voltage BV delivered by N channel MOS transistor 106a at substitution information setting to a node N106, an anti fuse 106d connected between node N106 and the ground node, and N channel MOS transistors 106c and 106e connected in series between node N104 and the ground node.

N channel MOS transistor 106c has a gate connected to node N106 and N channel MOS transistor 106e has a gate receiving address signal /A1.

When a fuse is not blown, fuse select signal BSIG0 is at an H level and setting portions 106–112 are selected. Accordingly, when N channel MOS transistors 106b, 108b, 110b and 112b are turned to a conductive state, power supply potential Vcc is supplied to nodes N106, N108, N110 and N112, and N channel MOS transistors 106c, 108c, 110c and 112c are all turned to a conductive state.

Then, as one of N channel MOS transistors 106e, 108e, 110e and 112e is always turned to a conductive state according to the address information, the potential of node N104 is turned to a ground state. As a result, N channel MOS transistor 104 is turned to a nonconductive state and spare select signal SPSEL0 is not output to spare address decoder 54. Thus, before the anti fuse is blown, spare address decoder 54 is not used. Accordingly, the inactivation signal from decoder inactivating circuit 48 shown in FIG. 2 is not output, and main address decoder 50 selects main memory cell 52 according to the address signal.

When the substitution address is to be stored, the plurality of anti fuses are selectively blown by a high voltage. As an example, assume that an address No. 2 (A0=0, A1=1) of a main memory cell to be substituted is to be stored in the spare memory cell by fuse select signal BSIG0. In FIG. 5, address signals A0, /A0, A1, /A1 are at the levels (L, H, H, L), respectively, when the address No.2 is selected. Then, N channel MOS transistors 112e, 110e, 108e and 106e are in a nonconductive state, a conductive state, a conductive state and a nonconductive state, respectively. Similarly, N channel MOS transistors 112a, 110a, 108a, and 106a are in a nonconductive state, a conductive state, a conductive state and a nonconductive state, respectively.

Therefore, when fuse select address signal BSEL is set as BSEL0=0, BSEL1=0, decoding of fuse select address signal BSEL by the fuse select decoder shown in FIG. 4 results in the selection and activation of fuse select signal BSIG0. Then, fuse select signal BSIG0 in an active state is input to substitution address setting circuit 46 shown in FIG. 5.

Accordingly, N channel MOS transistors 112b, 110b, 108b and 106b are all turned to a conductive state.

Here, by applying a sufficiently high voltage to blow the anti fuse (6V, for example) as high voltage BV, high voltage BV is applied to anti fuses 110d and 108d via N channel MOS transistors 110a, 108a, and 110b, 108b in a conductive state as described above. Then, anti fuses 110d and 108d are blown and turned to a conductive state.

Then, node N110 and node N108 will always be at an L level and N channel MOS transistors 110c and 108c will not be conductive. Thus, the substitution address is stored.

Thereafter in this semiconductor memory device, node N104 is not coupled to the ground potential and at an H level and spare select signal SPSEL0 is applied to spare address decoder 54 only when the substituted address No. 2 (A0=0, A1=1) described above is applied. In this case, a corresponding spare memory cell is selected and main address decoder 50 does not accept the address signal because of the function of decoder inactivating circuit 48 shown in FIG. 2.

Substitution address setting circuit 46 as shown in FIG. 5 can set a substitution address simply by an electric signal supplied from an external source to a terminal because the fuse blow by the laser is not necessary. Therefore, substitution can be performed again even after the encapsulation into the package following the substitution in a wafer condition.

In FIG. 5, only a setting portion provided corresponding to fuse select signal BSIG0 is shown. Setting portions with the same structures are provided corresponding to fuse select signals BSIG1–BSIG3, as well.

With reference to FIG. 6, it is shown that when fuse select address signal BSEL0 is (BSEL1, BSEL0)=(0,0), fuse select signal BSIG0 is activated and other fuse select signals are in an inactive states. When (BSEL1, BSEL0)=(0,1), fuse select signal BSIG1 is activated and other fuse select signals are inactivated. When (BSEL1, BSEL0)=(1,0), fuse select signal BSIG2 is activated and other fuse select signals are inactivated. When (BSEL1, BSEL0)=(1,1), fuse select signal BSIG3 is activated and other fuse select signals are inactivated.

At the second substitution, the fuse select address signal is inverted by inverter 70 shown in FIG. 3 and the decoding is performed by fuse select circuit 44 shown in FIG. 2. Then, if (BSEL1, BSEL0)=(0,0), fuse select signal BSIG3 is activated.

When (BSEL1, BSEL0)=(0,1), fuse select signal BSIG2 is activated. When (BSEL1, BSEL0)=(1,0), fuse select signal BSIG1 is activated. When (BSEL1, BSEL0)=(1,1), fuse select signal BSIG0 is activated.

As can be seen from FIGS. 6 and 7, at the first repair, the fuse select signals are activated in the order of BSIG0, BSIG1, BSIG2 and BSIG3, as a value of fuse select address signal increases. At the second repair, the order is reversed and fuse select signals are activated from BSIG3 to BSIG2, BSIG1 and to BSIG0.

Thus, it is possible to preferentially use an unused spare memory cell at the second repair. In some cases, all spares are used at the first repair and in other cases the number of spares necessary for the second substitution is larger than the number of unused spares. In such cases, the device cannot repaired through two substitutions after all and the matter is not the repeated selection of the same address. In such cases, the semiconductor memory device will be determined to be defective at the inspection in a subsequent process and excluded from shipment.

With the structure described above, even if information of use of a spare of the redundant circuit employed at the first substitution is not stored in the semiconductor memory device or an external memory device, the spare already used at the first substitution will not be selected again when the second substitution is necessary, and a semiconductor memory device which can be repaired will not be rendered defective.

Modification of First Embodiment

Figure 8:
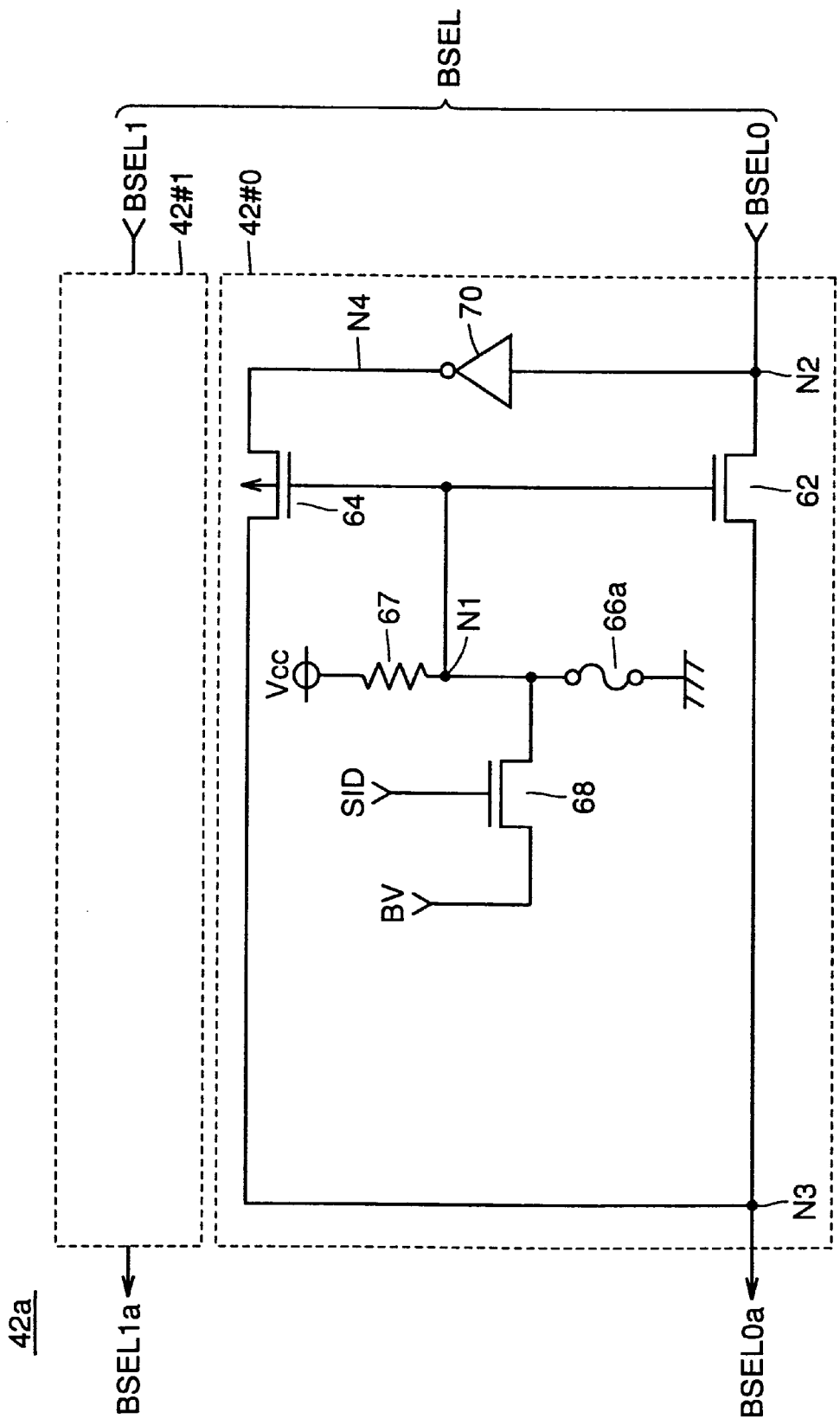
FIG. 8 is a circuit diagram showing a structure of complementary address generation circuit 42a which is another example of a structure of complementary address generation circuit 42 shown in FIG. 3.

FIG. 8 is a circuit diagram showing a structure of a complementary address generation circuit 42a according to the modification of the first embodiment.

With reference to FIG. 8, complementary address generation circuit 42a has the same structure with complementary address generation circuit 42 shown in FIG. 3 except that a fuse element 66a is employed instead of anti fuse 66. As other portion is same with complementary address generation circuit 42 shown in FIG. 3, the description thereof will not be repeated.

Before being blown, fuse element 66a is a resistance. When a high voltage is applied between electrodes at the blow, a current flows through fuse element 66a and fuse element 66a is blown by the heat. When resistance 67 is formed to have a sufficiently higher resistance than fuse element 66a, node N1 will be at an L level before the blow and at an H level after the blow. Hence, as in the first embodiment, signal BSEL0a has opposite polarity before and after the blow.

As in the first embodiment, according to this modification, a spare already used in the first substitution will not be selected in the second substitution after the packaging. Thus, a repairable semiconductor memory device will not be rendered defective.

Second Embodiment

Figure 9:
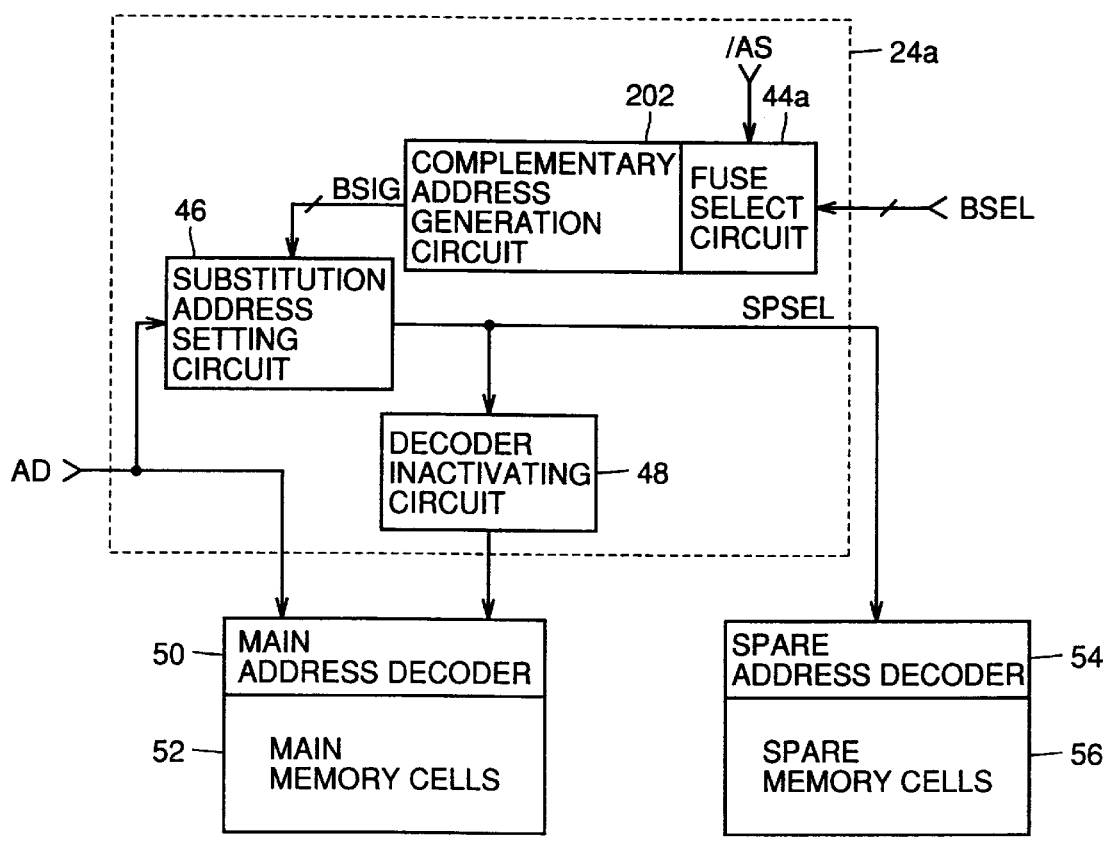
FIG. 9 is a block diagram showing a structure of a substitution control circuit 24a according to the second embodiment.

With reference to FIG. 9, a substitution control circuit 24a is different from substitution control circuit 24 shown in FIG. 2 in that substitution control circuit 24a includes a fuse select circuit 44a and a complementary address generation circuit 202 in the following stage in place of fuse select circuit 44 and complementary address select circuit 42. In other point, the structure of substitution control circuit 24a is same with that of substitution control circuit 24 and the description thereof will not be repeated.

Figure 10:
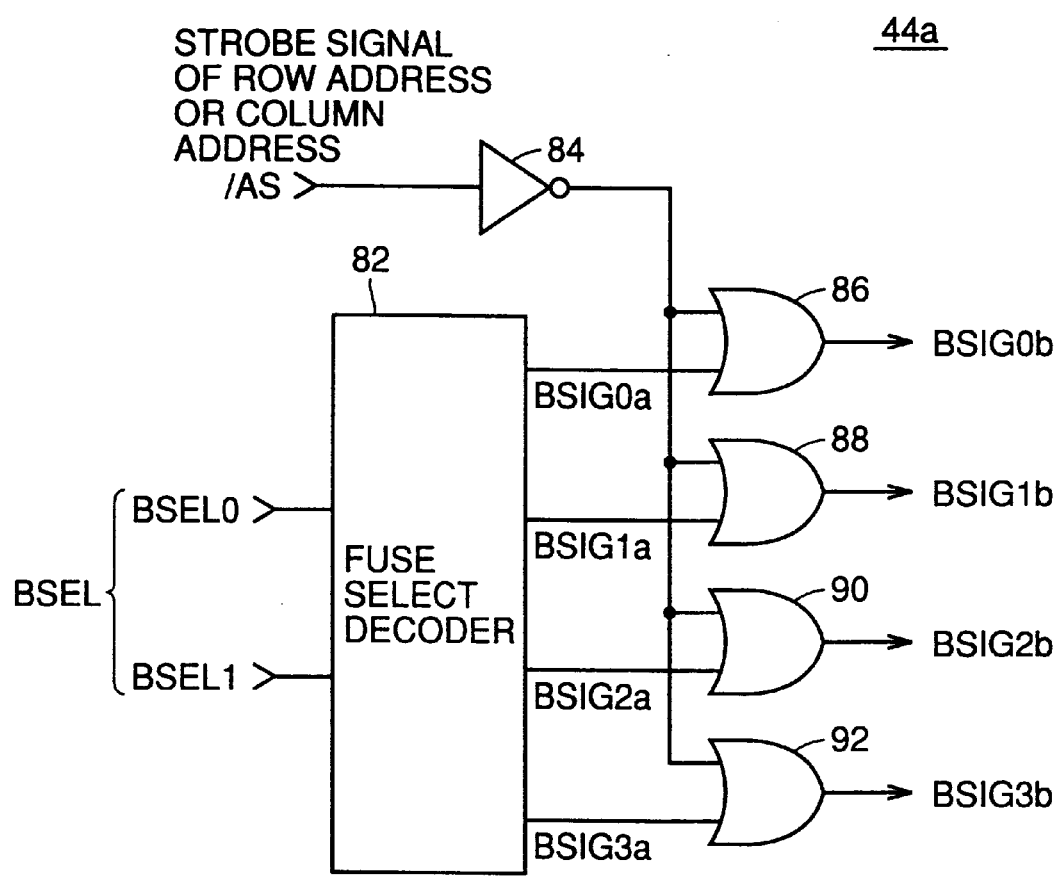
FIG. 10 is a circuit diagram showing a structure of a fuse select circuit 44a shown in FIG. 9.

With reference to FIG. 10, fuse select circuit 44a has the same structure with fuse select circuit 44 shown in FIG. 4 but different from fuse select circuit 44 in that the fuse select decoder receives fuse select signal BSEL0 and BSEL1 and OR circuits 86, 88, 90 and 92 supply signals BSIG0b, BSIG1b, BSIG2b and BSIG3b as outputs. In other points, two circuits are same and the description of the same portions will not be repeated.

Figure 11:
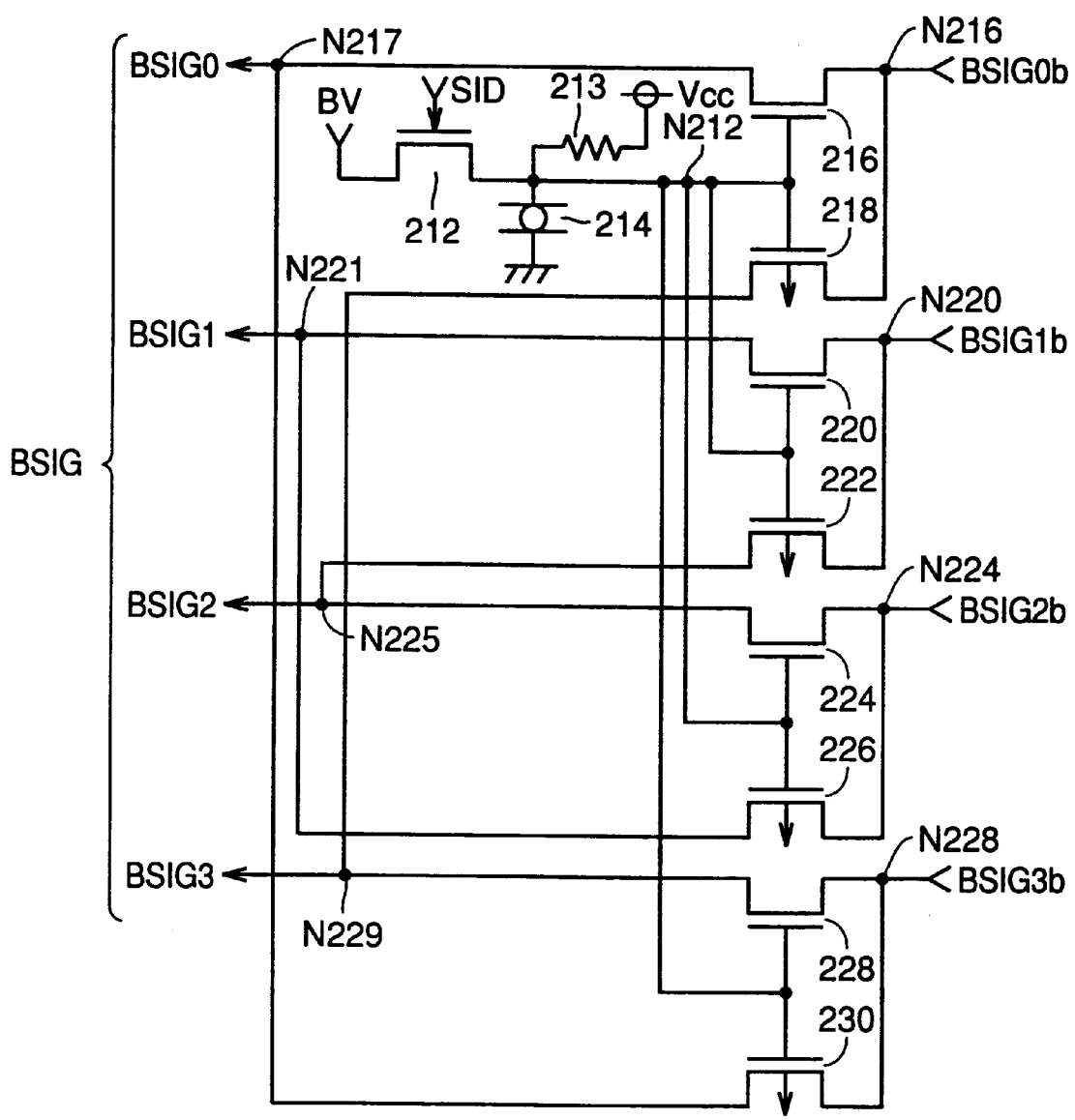
FIG. 11 is a circuit diagram showing a structure of a complementary address generation circuit 202 shown in FIG. 9.

With reference to FIG. 11, complementary address generation circuit 202 includes an N channel MOS transistor 212 activated by identification signal SID and transmitting high voltage BV to a node N212, an anti fuse 214 connected between node N212 and a ground node, and a resistance 213 connected between a power supply node receiving power supply potential Vcc and node N212. When identification signal SID is activated after the completion of first fuse blow, high voltage BV is applied to node N212. Then, anti fuse 214 is blown and turned from a nonconductive state to a conductive state. Then node N212 is turned to an L level.

Complementary address generation circuit 202 further includes an N channel MOS transistor 216 connected between a node N216 and a node N217 and having a gate connected to node N212, a P channel MOS transistor 218 connected between node N216 and a node N229 and having a gate connected to node N212, an N channel MOS transistor 220 connected between a node N220 and a node N221 and having a gate connected to node N212, a P channel MOS transistor 222 connected between node N220 and a node N225 and having a gate connected to node N212, an N channel MOS transistor 224 connected between a node N224 and node N225 and having a gate connected to node N212, a P channel MOS transistor 226 connected between node N224 and node N221 and having a gate connected to node N212, an N channel MOS transistor 228 connected between a node N228 and a node N229 and having a gate connected to node N212 and a P channel MOS transistor 230 connected between node N228 and node N217 and having a gate connected to node N212.

Nodes N216, N220, N224 and N228 receive fuse select signals BSIG0b, BSIG1b, BSIG2b and BSIG3b, respectively, supplied as outputs from fuse select circuit 44a shown in FIG. 9. In addition, nodes N217, N221, N225 and N229 supply fuse select signals BSIG0, BSIG1, BSIG2 and BSIG3, respectively, as outputs to substitution address setting circuit 46 shown in FIG. 9.

In the second embodiment, a substitution is determined to be the first substitution or the second substitution based on the state of anti fuse 214. At the first substitution, as anti fuse 214 is not blown, the potential of node N212 is turned to power supply potential Vcc via resistance 213 and N channel MOS transistors 216, 220, 224 and 228 are all turned to a conductive state, whereas, P channel MOS transistors 218, 222, 226 and 230 are turned to a nonconductive state. Hence, signals BSIG0b–BSIG3b supplied from fuse select circuit 44a as outputs are directly supplied to substitution address setting circuit 46 as BSIG0–BSIG3. The correspondence of the signals is then same as that shown in FIG. 6. When necessary processes for the first substitution are all finished, identification signal SIG is activated at an external testing device or an internal circuit not shown and a sufficiently high voltage for blowing the anti fuse, a voltage of 6V, for example, is applied to one electrode of the anti fuse as high voltage BV. Then, anti fuse 214 is blown and becomes conductive and the potential of node N212 is maintained at an L level afterwards.

At the second substitution, as the potential of node N212 is at an L level, N channel MOS transistors 216, 220, 224 and 228 are turned to a nonconductive state, whereas P channel MOS transistors 218, 222, 226 and 230 are turned to a conductive state. Then, destination of fuse select signal BSIG is changed and the signal is output according to the same correspondence as in the first embodiment shown in FIG. 7.

Thus, also in the semiconductor memory device with the redundant circuit shown in the second embodiment, a spare already used in the first substitution will not be selected in the second substitution after the packaging. Thus, a repairable semiconductor memory device will not be rendered defective.

Though in FIG. 11, the order of the fuse select signals is changed by a connection switching circuit formed by N channel MOS transistors 216, 220, 224 and 228 and P channel MOS transistors 218, 222, 226 and 230, the correspondence can be changed by a logic circuit, an ROM or the like as well.

Modification of Second Embodiment

Figure 12:
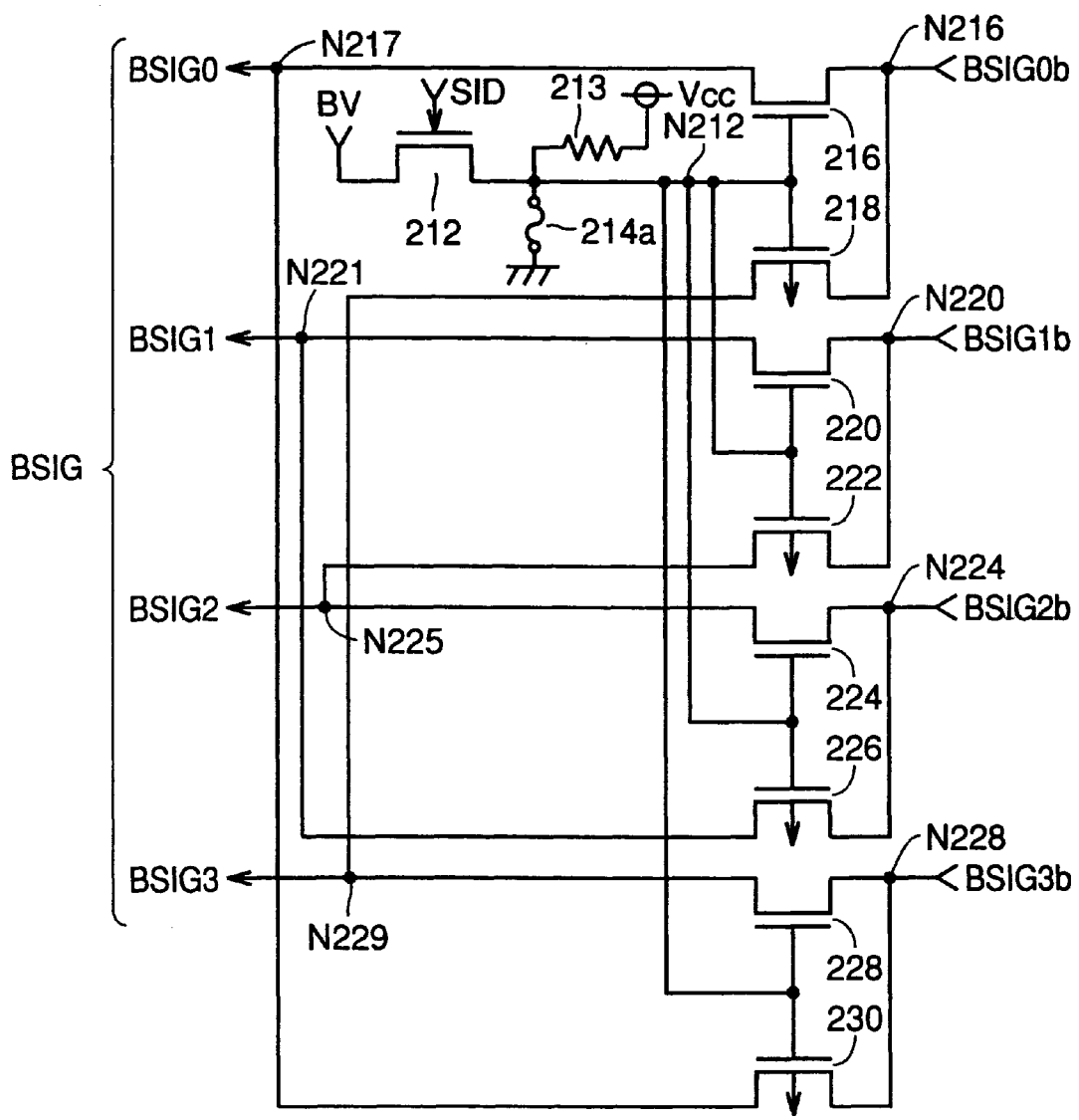
FIG. 12 is a circuit diagram showing a structure of a complementary address generation circuit 202a according to a modification of the second embodiment.
Figure 13:
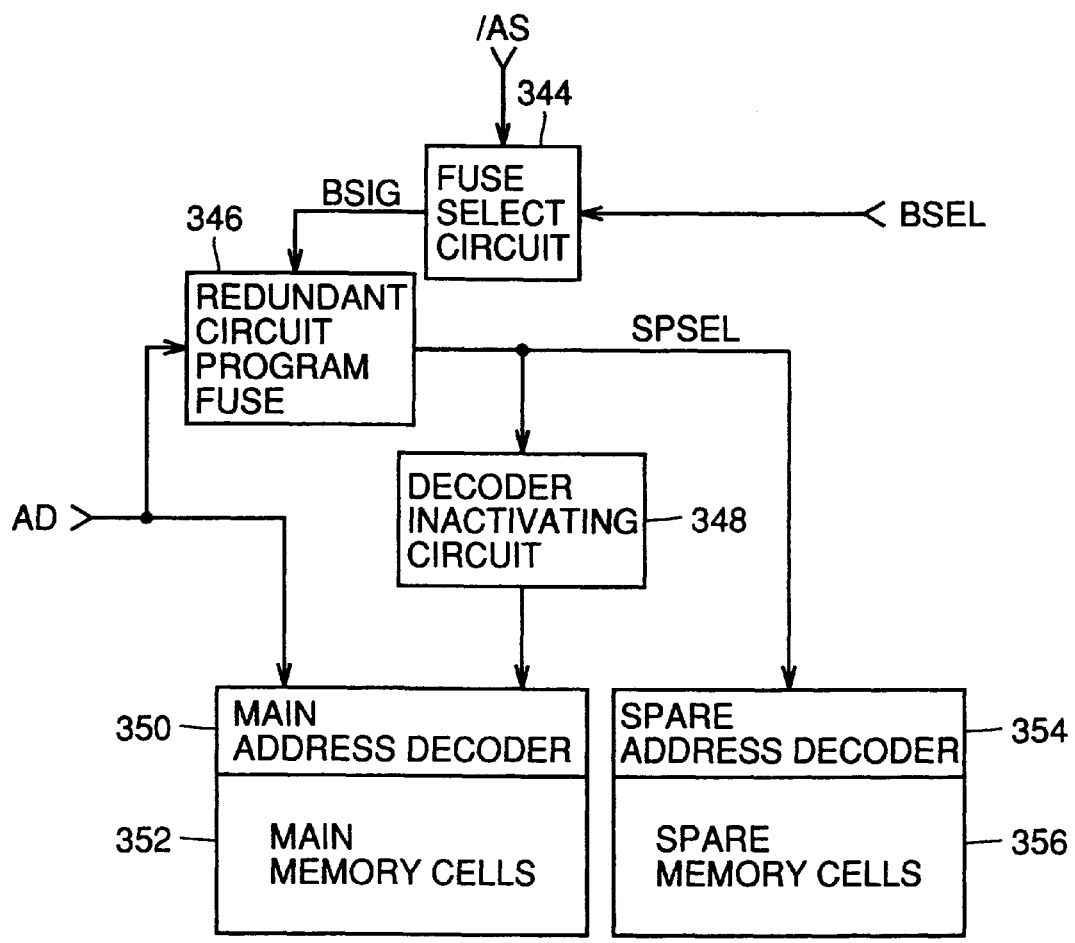
FIG. 13 is a block diagram showing an internal structure of a conventional semiconductor memory device having a redundant circuit and particularly referenced for describing how a spare is selected.
Figure 14:
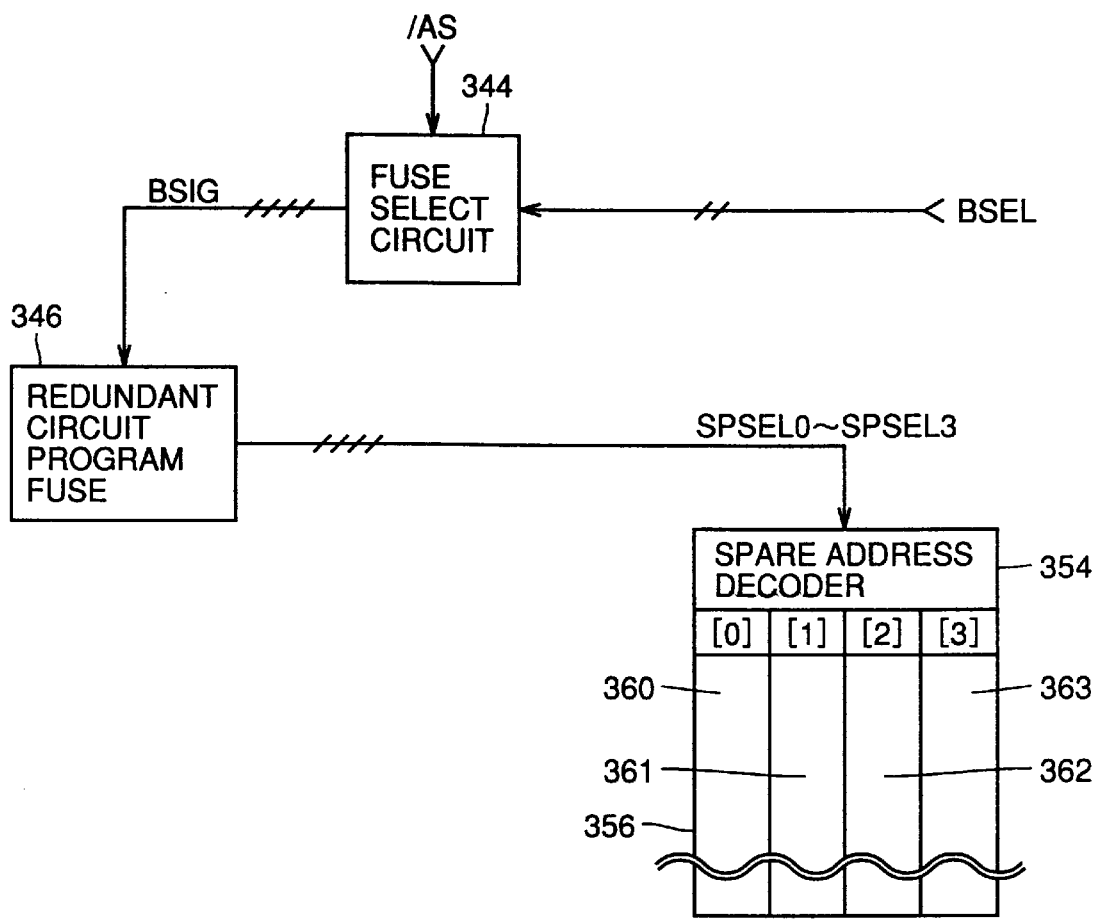
FIG. 14 is a schematic block diagram referenced for describing a process of selecting a spare.

With reference to FIG. 12, complementary address generation circuit 202a has the same structure with comple-mentary address generation circuit 202 shown in FIG. 11 except that a fuse element 214a is included instead of anti fuse 214. As other portion is same with complementary address generation circuit 202 shown in FIG. 11, the description thereof will not be repeated.

Before being blown, fuse element 214a is a resistance. When a high voltage is applied between electrodes at the blow, a current flows through fuse element 214a and fuse element 214a is blown by the heat. When resistance 213 is formed to have a sufficiently higher resistance than fuse element 214a, node N212 will be at an L level before the blow and at an H level after the blow. Hence, as in the second embodiment, the order of signals BSIG0–BSIG3 is changed before and after the blow.

As in the second embodiment, according to this modification, a spare already used in the first substitution will not be selected in the second substitution after the packaging. Thus, a repairable semiconductor memory device will not be rendered defective.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
  (a) a regular memory cell region, including
    (a-1) a plurality of regular memory cell groups each including a plurality of regular memory cells;
  (b) a main address decoder provided corresponding to said regular memory cell region and selecting one of said regular memory cell groups in response to an address signal;
  (c) a spare memory cell region, said spare memory cell region including
    (c-1) a plurality of spare memory cell groups each including a plurality of spare memory cells and usable in place of said regular memory cell groups by substitution;
  (d) a spare address decoder provided corresponding to said spare memory cell region and selecting one of said spare memory cell groups in response to a spare address signal;
  (e) a substitution control circuit holding a substitution address data corresponding to a substitution address of said regular memory cell group to be substituted by said spare memory cell group, inactivating said main address decoder and supplying said spare address signal as an output when said address signal matches with said substitution address, said substitution control circuit including,
    (e-1) a plurality of address setting portions provided corresponding to said plurality of spare memory cell groups, respectively, and holding said substitution address data, and
    (e-2) a setting portion select circuit selecting one of said plurality of address setting portions according to a setting portion select signal,
      said setting portion select circuit having a holding circuit holding in a non-volatile manner, information that substitution operation of substituting said regular memory cell group with said spare memory cell group has been performed and determining an order of priority of use of said plurality of address setting portions corresponding to said setting portion select signal according to the information held by said holding circuit.

2. The semiconductor memory device according to claim 1, wherein said setting portion select circuit further includes a converting circuit receiving said setting portion select signal and supplying the setting portion select signal as an output when the information held in said holding circuit indicates that substitution has not been performed, and inverting and supplying each signal bit of said setting portion select signal as an output when the information held in said holding circuit indicates that substitution has been performed, and a setting portion select decoder receiving and decoding the output of said converting circuit and selecting one of said plurality of address setting portion.

3. The semiconductor memory device according to claim 2, wherein said converting circuit includes a complementary address generation circuit inverting each signal bit of said setting portion select signal, and a select circuit receiving said setting portion select signal and an output of said complementary address generation circuit and selecting one of said setting portion select signal and the output of said complementary address generation circuit according to the information held in said holding circuit and supplying the selected signal to said setting portion select decoder.

4. The semiconductor memory device according to claim 3, wherein said complementary address generation circuit has a plurality of inverters receiving signal bits of said setting portion select signal, respectively, said holding circuit has an anti fuse holding the information held in said holding circuit when a predetermined high voltage is applied between electrodes of said anti fuse and a portion between the electrodes is turned to a conductive state at completion of said substitution operation, and said select circuit selecting and supplying one of said setting portion select signal and the output of said complementary address generation circuit as an output in response to the conductive state between electrodes of said anti fuse.

5. The semiconductor memory device according to claim 3, wherein said complementary address generation circuit has a plurality of inverters receiving signal bits of said setting portion select signal, respectively, said holding circuit has an electric fuse holding the information held in said holding circuit when a predetermined high voltage is applied between electrodes of said electric fuse and a portion between the electrodes is turned to a nonconductive state at completion of said substitution operation, and said select circuit selecting and supplying one of said setting portion select signal and the output of said complementary address generation circuit as an output in response to the conductive state between electrodes of said electric fuse.

6. The semiconductor memory device according to claim 1, wherein said setting portion select circuit further includes a setting portion select decoder receiving and decoding said setting portion select signal, and an order reversing circuit supplying signal bits in normal order of an output signal of said setting portion select decoder as outputs when the information held in said holding circuit indicates that substitution has not been performed and reversing an order of the signal bits of the output signal of said setting portion select decoder and supplying the signal bits in reverse order as outputs when the information held in said holding circuit indicates that substitution has been performed.

7. The semiconductor memory device according to claim 6, wherein the output signal of said setting portion select decoder is an n-bit output signal, said order reversing circuit selects and performs, one operation of an operation activating a kth bit from the lowest bit in the n-bit outputs of said order reversing circuit when a kth bit from the highest bit of the n-bit outputs signal of said setting portion select decoder is activated, and an operation activating a kth bit from the highest bit of the n-bit outputs of said order reversing circuit when a kth bit from the highest bit of the n-bit outputs signal of said setting portion select decoder is activated, according to the information held in said holding circuit, where n is a natural number and k is a natural number smaller or equal to n.

8. The semiconductor memory device according to claim 7 wherein said holding circuit has an anti fuse holding the information held in said holding circuit when a predetermined high voltage is applied between electrodes of said anti fuse and a portion between the electrodes is turned to a conductive state at completion of said substitution operation.

9. The semiconductor memory device according to claim 7 wherein said holding circuit has an electric fuse holding the information held in said holding circuit when a predetermined high voltage is applied between electrodes of said electric fuse and a portion between the electrodes is turned to a nonconductive state at completion of said substitution operation.

10. The semiconductor memory device according to claim 1 wherein the information held in said holding circuit is inverted from a predetermined initial state at completion of said substitution operation in a wafer condition, the semiconductor memory device further comprises a first terminal group receiving said substitution address data for performing said substitution operation again in a package condition, and a second terminal group receiving said setting portion select signal for performing said substitution operation again in a package condition, each of said address setting portions has an address bit setting portion selected according to said setting portion select signal and said substitution address data and holding information corresponding to said substitution address data.

11. The semiconductor memory device according to claim 1 wherein said regular memory cell groups correspond to memory cell rows of said regular memory cell region, respectively, said address signal includes a row address signal, said main address decoder corresponds to a row address decoder receiving said row address signal and selecting one of said regular memory cell rows, and said spare memory cell groups correspond to spare memory cell rows of said spare memory cell region usable in place of said regular memory cell rows by substitution, respectively, said spare address signal includes a spare row address signal, said spare address decoder corresponds to a spare row address decoder receiving said spare row address signal and selecting one of said spare memory cell rows, and said substitution address data includes substitution row address data corresponding to a row address of said regular memory cell row to be substituted.

12. The semiconductor memory device according to claim 1 wherein said regular memory cell groups correspond to memory cell columns of said regular memory cell region, respectively, said address signal includes a column address signal, said main address decoder corresponds to a column address decoder receiving said column address signal and selecting one of said regular memory cell columns, and said spare memory cell groups correspond to spare memory cell columns of said spare memory cell region usable in place of said regular memory cell columns by substitution, respectively, said spare address signal includes a spare column address signal, said spare address decoder corresponds to a spare column address decoder receiving said spare column address signal and selecting one of said spare memory cell columns, and said substitution address data includes substitution column address data corresponding to a column address of said regular memory cell column to be substituted.

\* \* \* \* \*